(12) United States Patent  (10) Patent No.: US 8,306,081 B1
Schmidt et al.  (45) Date of Patent: Nov. 6, 2012

(54) HIGH INDIUM CONTAINING INGAN SUBSTRATES FOR LONG WAVELENGTH OPTICAL DEVICES

(75) Inventors: Mathew Schmidt, Goleta, CA (US); Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 229 days.

(21) Appl. No.: 12/785,404

(22) Filed: May 21, 2010

Related U.S. Application Data

(60) Provisional application No. 61/181,608, filed on May 27, 2009.

(51) Int. Cl.
*H01S 5/00* (2006.01)
(52) U.S. Cl. ........... 372/43.01; 372/44.011; 372/45.012; 372/49.01
(58) Field of Classification Search ............... 372/43.01, 372/44.011, 49.01
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,541,115 B2 | 4/2003 | Pender et al. | |

(Continued)

FOREIGN PATENT DOCUMENTS

JP  2005-289797 A2  10/2005

(Continued)

OTHER PUBLICATIONS

Chiang et al. "Luminescent Properties of Cerium-Activated Garnet Series Phosphor: Structure and Temperature Effects," Journal of the Electrochemical Society 155:B517-B520 (2008).

(Continued)

*Primary Examiner* — Dung Nguyen
(74) *Attorney, Agent, or Firm* — Kilpatrick Townsend & Stockton LLP

(57) ABSTRACT

An improved optical device. The device has a gallium nitride substrate member comprising indium entities, gallium entities, and nitrogen entities. In one or more embodiments, the gallium nitride substrate member has an indium content ranging from about 1 to about 50% in weight. Preferably, the gallium nitride substrate member has a semipolar crystalline surface region or a non-polar crystalline surface region. The device has an epitaxially formed laser stripe region comprising an indium content ranging from about 1 to about 50% and formed overlying a portion of the semipolar crystalline orientation surface region or the non-polar crystalline surface region. The laser stripe region is characterized by a cavity orientation in a predefined direction according to a specific embodiment. The laser strip region has a first end and a second end including respective a first cleaved facet provided on the first end of the laser stripe region and a second cleaved facet provided on the second end of the laser stripe region.

20 Claims, 4 Drawing Sheets

U.S. PATENT DOCUMENTS

| | | | |
|---|---|---|---|
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |
| 6,764,297 B2 | 7/2004 | Godwin et al. | |
| 6,765,240 B2 | 7/2004 | Tischler et al. | |
| 6,806,508 B2 | 10/2004 | D'Evelyn et al. | |
| 6,858,882 B2 | 2/2005 | Tsuda et al. | |
| 6,861,130 B2 | 3/2005 | D'Evelyn et al. | |
| 6,936,488 B2 | 8/2005 | D'Evelyn et al. | |
| 6,955,719 B2 | 10/2005 | Dmitriev et al. | |
| 7,009,199 B2 | 3/2006 | Hall et al. | |
| 7,009,215 B2 | 3/2006 | D'Evelyn et al. | |
| 7,026,755 B2 | 4/2006 | Setlur et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,122,827 B2 | 10/2006 | Alizadeh et al. | |
| 7,125,453 B2 | 10/2006 | D'Evelyn et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,208,393 B2 | 4/2007 | Haskell et al. | |
| 7,220,658 B2 | 5/2007 | Haskell et al. | |
| 7,291,544 B2 | 11/2007 | D'Evelyn et al. | |
| 7,316,746 B2 | 1/2008 | D'Evelyn et al. | |
| 7,329,371 B2 | 2/2008 | Setlur et al. | |
| 7,335,262 B2 | 2/2008 | Dwilinski et al. | |
| 7,338,828 B2 | 3/2008 | Imer et al. | |
| 7,358,542 B2 | 4/2008 | Radkov et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,572,425 B2 | 8/2009 | McNulty et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 2001/0011935 A1 | 8/2001 | Lee et al. | |
| 2001/0048114 A1 | 12/2001 | Morita et al. | |
| 2002/0105986 A1 | 8/2002 | Yamasaki | |
| 2002/0189532 A1 | 12/2002 | Motoki et al. | |
| 2003/0027014 A1 | 2/2003 | Johnson et al. | |
| 2003/0140845 A1 | 7/2003 | D'Evelyn et al. | |
| 2003/0145784 A1 | 8/2003 | Thompson et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0104391 A1 | 6/2004 | Maeda et al. | |
| 2004/0161222 A1 | 8/2004 | Niida et al. | |
| 2004/0222357 A1 | 11/2004 | King et al. | |
| 2005/0098095 A1 | 5/2005 | D'Evelyn et al. | |
| 2005/0109240 A1 | 5/2005 | Maeta et al. | |
| 2005/0128469 A1* | 6/2005 | Hall et al. | 356/237.1 |
| 2005/0191773 A1 | 9/2005 | Suzuki et al. | |
| 2005/0205215 A1 | 9/2005 | Giddings et al. | |
| 2006/0030738 A1 | 2/2006 | Vanmaele et al. | |
| 2006/0037529 A1 | 2/2006 | D'Evelyn et al. | |
| 2006/0038193 A1 | 2/2006 | Wu et al. | |
| 2006/0048699 A1 | 3/2006 | D'Evelyn et al. | |
| 2006/0096521 A1 | 5/2006 | D'Evelyn et al. | |
| 2006/0177362 A1 | 8/2006 | D'Evelyn et al. | |
| 2006/0207497 A1 | 9/2006 | D'Evelyn et al. | |
| 2006/0213429 A1 | 9/2006 | Motoki et al. | |
| 2006/0214287 A1 | 9/2006 | Ogihara et al. | |
| 2006/0228870 A1 | 10/2006 | Oshima | |
| 2006/0246687 A1 | 11/2006 | Kaiser et al. | |
| 2006/0255343 A1 | 11/2006 | Ogihara et al. | |
| 2006/0289386 A1 | 12/2006 | Tysoe et al. | |
| 2007/0015345 A1 | 1/2007 | Baker et al. | |
| 2007/0057337 A1* | 3/2007 | Kano et al. | 257/431 |
| 2007/0077674 A1 | 4/2007 | Okuyama et al. | |
| 2007/0105351 A1 | 5/2007 | Motoki et al. | |
| 2007/0141819 A1 | 6/2007 | Park | |
| 2007/0142204 A1 | 6/2007 | Park et al. | |
| 2007/0151509 A1 | 7/2007 | Park | |
| 2007/0158785 A1 | 7/2007 | D'Evelyn et al. | |
| 2007/0164292 A1 | 7/2007 | Okuyama | |
| 2007/0166853 A1 | 7/2007 | Guenther et al. | |
| 2007/0178039 A1 | 8/2007 | D'Evelyn et al. | |
| 2007/0181056 A1 | 8/2007 | D'Evelyn et al. | |
| 2007/0190758 A1 | 8/2007 | Kaeding et al. | |
| 2007/0197004 A1 | 8/2007 | Dadgar et al. | |
| 2007/0210074 A1 | 9/2007 | Maurer et al. | |
| 2007/0234946 A1 | 10/2007 | Hashimoto et al. | |
| 2007/0252164 A1 | 11/2007 | Zhong et al. | |
| 2007/0274359 A1* | 11/2007 | Takeuchi et al. | 372/46.01 |
| 2007/0290224 A1 | 12/2007 | Ogawa | |
| 2008/0008855 A1 | 1/2008 | D'Evelyn et al. | |
| 2008/0083741 A1 | 4/2008 | Giddings et al. | |
| 2008/0087919 A1 | 4/2008 | Tysoe et al. | |
| 2008/0156254 A1 | 7/2008 | Dwilinski et al. | |
| 2008/0193363 A1 | 8/2008 | Tsuji | |
| 2008/0272462 A1 | 11/2008 | Shimamoto et al. | |
| 2008/0285609 A1 | 11/2008 | Ohta et al. | |
| 2009/0092536 A1 | 4/2009 | Kawabata et al. | |
| 2009/0218593 A1* | 9/2009 | Kamikawa et al. | 257/103 |
| 2009/0301387 A1 | 12/2009 | D'Evelyn | |
| 2009/0301388 A1 | 12/2009 | D'Evelyn | |
| 2009/0320744 A1 | 12/2009 | D'Evelyn | |
| 2009/0320745 A1 | 12/2009 | D'Evelyn et al. | |
| 2010/0000492 A1 | 1/2010 | D'Evelyn | |
| 2010/0001300 A1 | 1/2010 | Raring et al. | |
| 2010/0025656 A1* | 2/2010 | Raring et al. | 257/13 |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |

FOREIGN PATENT DOCUMENTS

| | | |
|---|---|---|
| JP | 2007-039321 A | 2/2007 |
| WO | WO 2005121415 A1 | 12/2005 |

OTHER PUBLICATIONS

Chiu et al. "Synthesis and Luminescence Properties of Intensely Red-Emitting M5Eu (WO$_4$)$_{4-x}$ (MoO$_4$)$_x$ (M = Li, Na, K) Phosphors," Journal of the Electrochemical Society 15:J71-J78 (2008).

Ci et al. "Ca$_{1-x}$Mo$_{1-y}$Nb$_y$O$_4$:Eu$_x$$^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in Eu$^{2+}$-doped Ba$_2$Si$_5$ N$_8$: fluorescence, thernoluminescence, and upconversion"; Journal of Physics and Chemistry of Solids 61:2001-2006 (2000).

Li et al. "The effect of replacement of Sr by Ca on the structural and luminescence properties of the red-emitting Sr$_2$Si$_5$N$_8$:Eu$_{2+}$ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of Ce$^{3+}$-doped (Lu$_2$CaMg$_2$)-Ca-2(Si, Ge)$_3$O$_{12}$ and its use in LED based lighting," Chemistry of Materials 18: 3314-3322 (2006).

Wang et al. "New red Y$_{0.85}$Bi$_{0.1}$Eu$_{0.05}$V$_{1-y}$M$_y$O$_4$ (M=Nb, P) phosphors for light-emitting diodes," Physica B: Condensed Matter 403:2071-2075 (Jun. 2008).

Yamamoto "White LED phosphors: the next step," Proceeding of SPIE (2010).

Yang et al. "Preparation and luminescence properties of LED conversion novel phosphors SrZnO$_2$:Sm," Materials Letters 62:907-910 (Mar. 2008).

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, AMMONO Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on *m*-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Sarva et al. "Dynamic compressive strength of silicon carbide under uniaxial compression," Mat. Sci. & Eng. A 317,140 (2001).

Office action for U.S. Appl. No. 12/497,969, (Feb. 2, 2012).
Office action for U.S. Appl. No. 12/478,736, (Feb. 7, 2012).
Office action for U.S. Appl. No. 12/569,841, (Dec. 23, 2011).
Office action for U.S. Appl. No. 12/724,983, (Mar. 5, 2012).
Office action for U.S. Appl. No. 12/491,176, (Mar. 1, 2012).
Fukuda et al "Prospects for the ammonothermal growth of large GaN crystal," Journal of Crystal Growth 305: 304-310 (Jul. 2007).

* cited by examiner

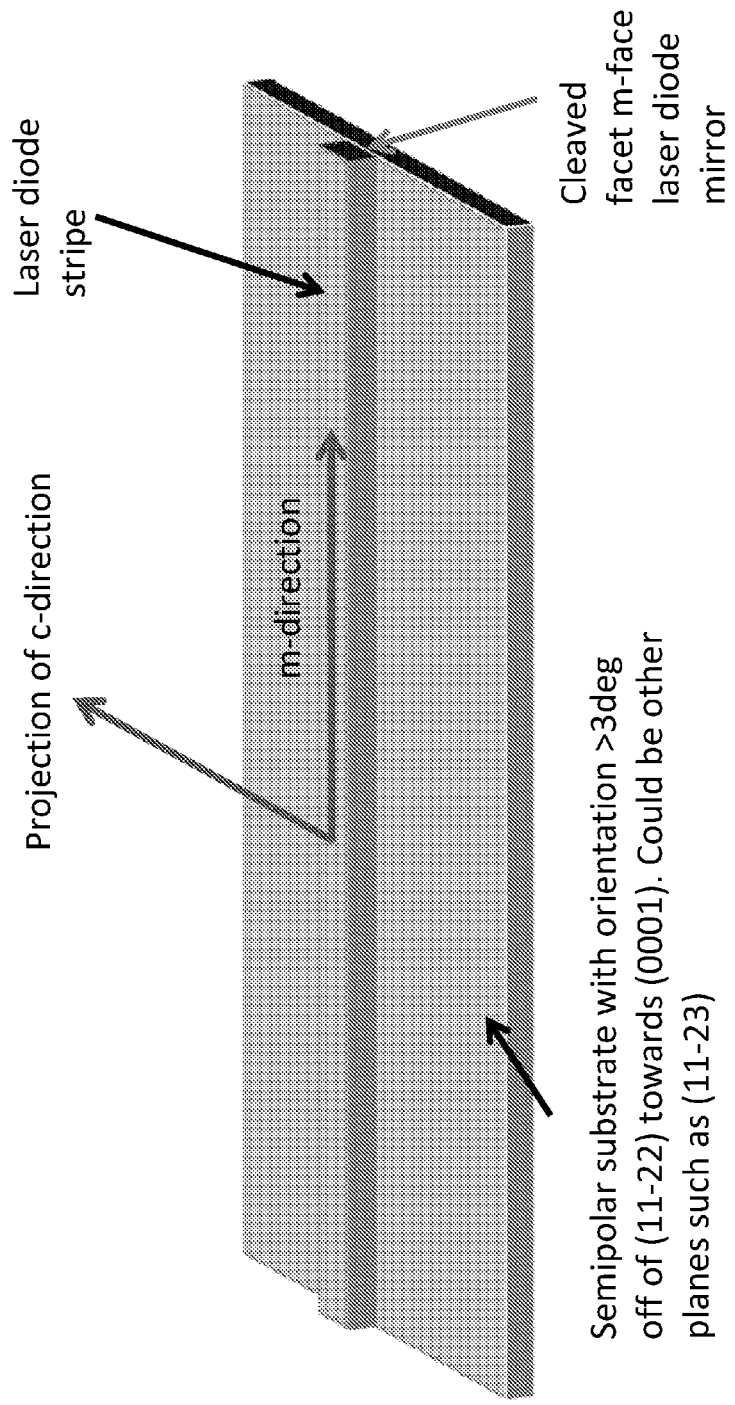
Figure 1A: m-direction laser diode on semipolar substrate with cleaved mirror

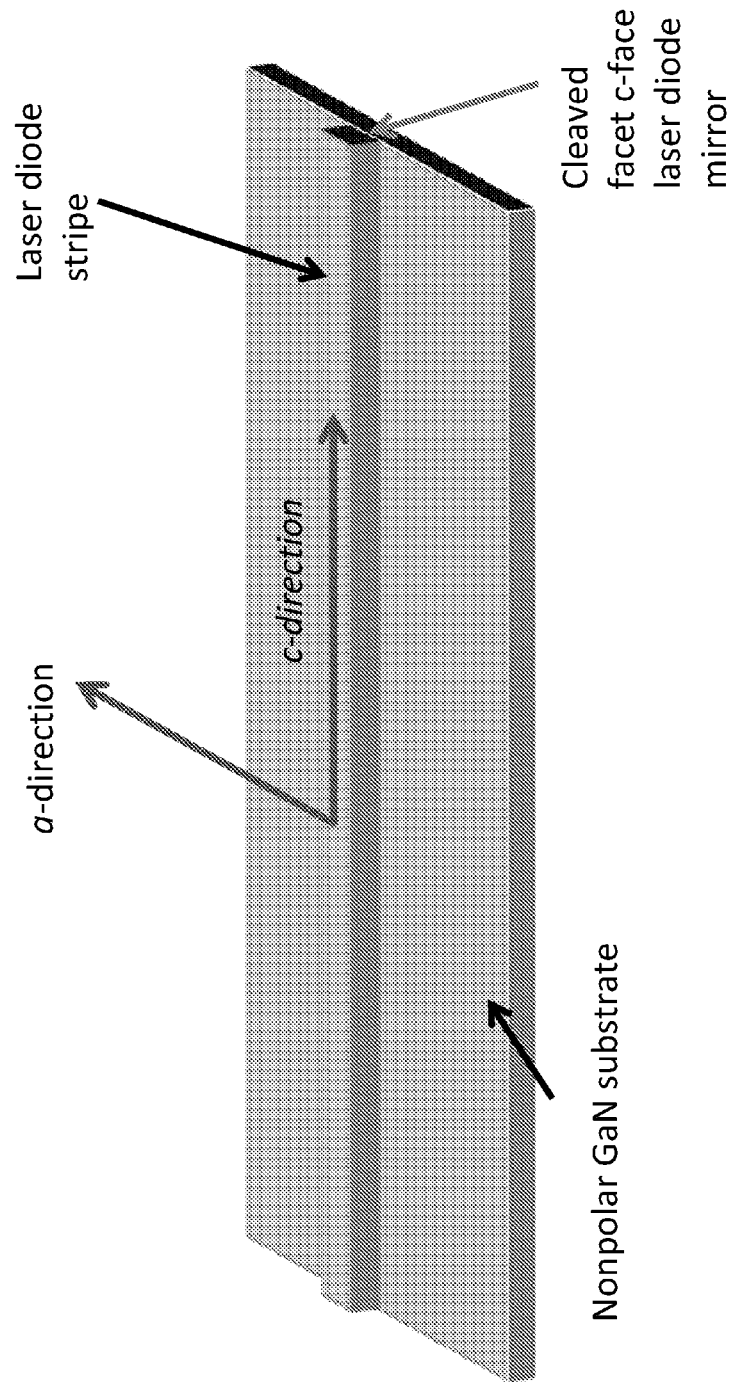
Figure 1B: c-direction laser diode on nonpolar substrate with cleaved mirror

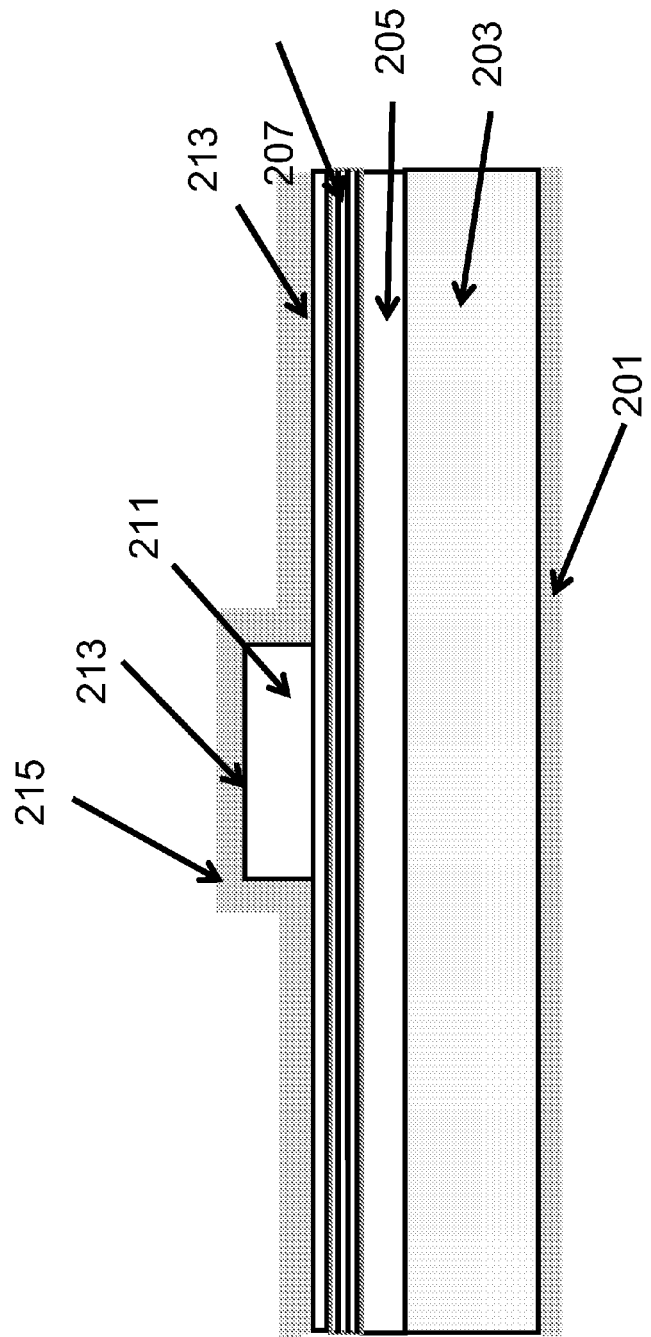

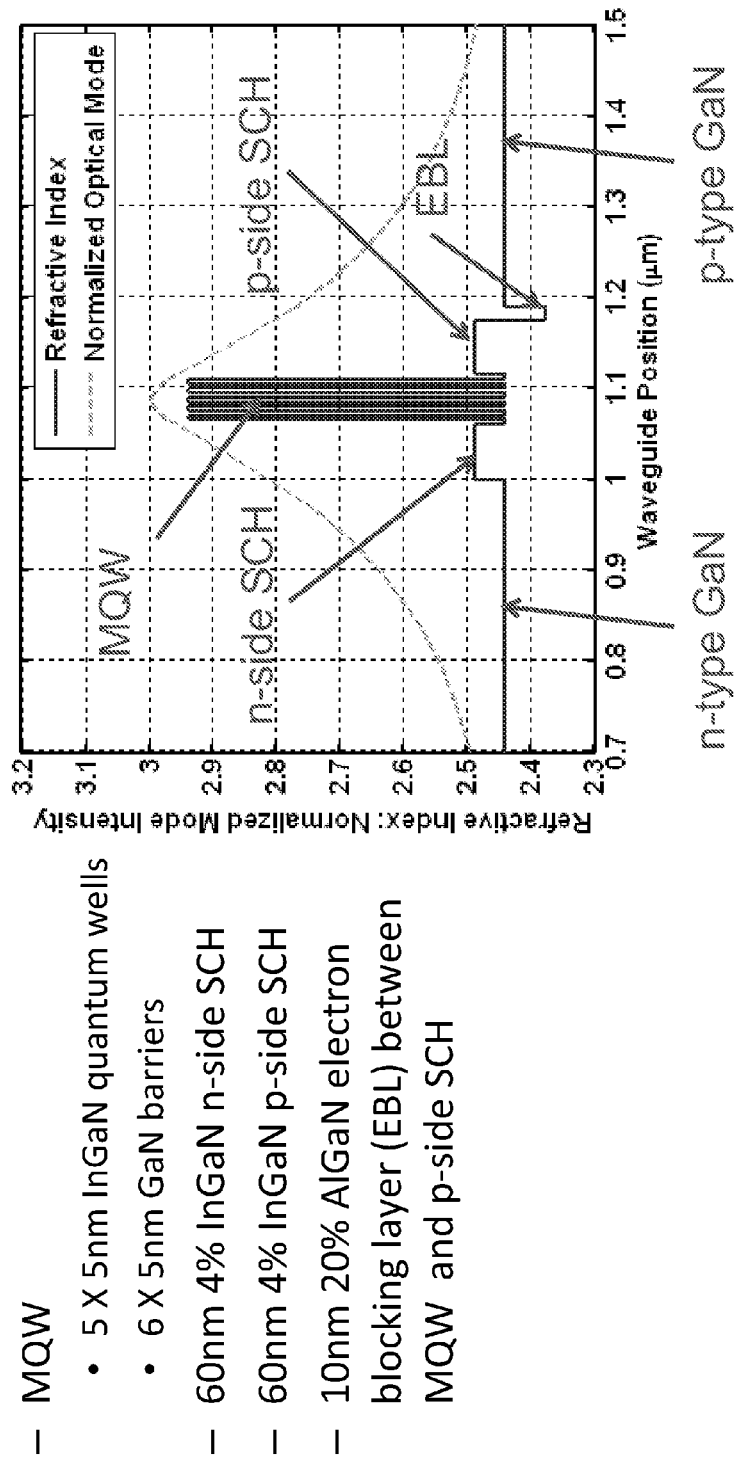
Figure 3: 485nm LD Preferred Design
- Preferred embodiment example
  - MQW
    - 5 X 5nm InGaN quantum wells
    - 6 X 5nm GaN barriers
  - 60nm 4% InGaN n-side SCH
  - 60nm 4% InGaN p-side SCH
  - 10nm 20% AlGaN electron blocking layer (EBL) between MQW and p-side SCH
- Index and optical mode profile

US 8,306,081 B1

HIGH INDIUM CONTAINING INGAN SUBSTRATES FOR LONG WAVELENGTH OPTICAL DEVICES

CROSS-REFERENCE TO RELATED APPLICATION

This application claims priority to U.S. Ser. No. 61/181,608, filed May 27, 2009, which is commonly assigned and hereby incorporated by reference.

BACKGROUND OF THE INVENTION

The present invention is directed to optical devices and related methods. More particularly, the present invention provides a method and device for emitting electromagnetic radiation using nonpolar or semipolar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb:

The conventional light bulb dissipates much thermal energy. More than 90% of the energy used for the conventional light bulb dissipates as thermal energy.

Reliability is an issue since the conventional light bulb routinely fails often due to thermal expansion and contraction of the filament element.

Light bulbs emit light over a broad spectrum, much of which does not result in bright illumination or due to the spectral sensitivity of the human eye.

Light bulbs emit in all directions and are not ideal for applications requiring strong directionality or focus such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state lasers had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the efficiency of the LPSS lasers, and further commercialization ensue into more high end specialty industrial, medical, and scientific applications. However, the change to diode pumping increased the system cost and required précised temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the present invention, techniques for optical devices and related methods are provided. More particularly, the present invention provides a method and device for emitting electromagnetic radiation using nonpolar or semipolar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In a specific embodiment, the present invention provides an optical device. The device has a gallium nitride substrate member comprising indium entities, gallium entities, and nitrogen entities. In one or more embodiments, the gallium nitride substrate member has an indium content ranging from about 1 to about 50% in weight, but can be lower or higher. Preferably, the gallium nitride substrate member has a semipolar crystalline surface region or a non-polar crystalline surface region. The device has an epitaxially formed laser stripe region comprising an indium content ranging from about 1 to about 50% and formed overlying a portion of the semipolar crystalline orientation surface region or the nonpolar crystalline surface region. The laser stripe region is characterized by a cavity orientation in a predefined direction according to a specific embodiment. The laser strip region has a first end and a second end including respective a first cleaved facet provided on the first end of the laser stripe region and a second cleaved facet provided on the second end of the laser stripe region.

In an alternative specific embodiment, the present invention provides an optical device. The optical device includes a gallium nitride substrate member comprising indium containing entities, gallium containing entities, and nitrogen containing entities. In a specific embodiment, the gallium nitride substrate member has an indium content ranging from about 0.1 to about 50% by weight. The gallium nitride substrate member has a semipolar crystalline surface region or a non-polar crystalline surface region. The optical device also has an epitaxially formed region comprising an indium content ranging from about 0.1 to about 50% by weight and formed overlying a portion of the semipolar crystalline orientation surface region or the non-polar crystalline surface region.

Benefits are achieved over pre-existing techniques using the present invention. In particular, the present invention enables a cost-effective optical device for laser applications or other optical applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar or non-polar gallium nitride material capable of achieve a green laser device, among others. In one or more embodiments, the laser device is capable of emitting long wavelengths such as those ranging from about 470 nm to greater than about 530 nm, but can be others. In a specific embodiment, the present method and device uses a high indium content starting substrate to form higher quality overlying epitaxial layers, which also have high indium content. In one or more embodiments, the high indium content leads to improved films and optical device performance. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1A is a simplified perspective view of a laser device fabricated on a semipolar substrate according to an embodiment of the present invention.

FIG. 1B is a simplified perspective view of a laser device fabricated on a non-polar substrate according to an embodiment of the present invention.

FIG. 2 is a detailed cross-sectional view of a laser device fabricated on a non-polar substrate according to an embodiment of the present invention.

FIG. 3 is a simplified diagram illustrating an epitaxial laser structure according to a preferred embodiment of the present invention.

DETAILED DESCRIPTION OF THE INVENTION

According to the present invention, techniques related generally to optical devices are provided. More particularly, the present invention provides a method and device for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

FIG. 1A is a simplified perspective view of a laser device 100 fabricated on a semipolar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having a semipolar or non-polar crystalline surface region. In a specific embodiment, the gallium nitride substrate member is a bulk GaN substrate characterized by having a semipolar or non-polar crystalline surface region, but there can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leqq x, y, x+y \leqq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$. In a specific embodiment, the device can be fabricated on a slightly off-cut semipolar substrate as described in U.S. Provisional No. 61/164,409 filed Mar. 28, 2009, commonly assigned, and hereby incorporated by reference herein.

In one or more embodiments, the gallium nitride or indium gallium nitride substrate member has an indium content ranging from about 1 to about 50% by weight. In other embodiments, other indium content ranges can also exist with other species and the like. The gallium nitride substrate member may be sliced from a gallium nitride boule, lapped, polished, and chemically mechanically polished according to methods that are known in the art. In some embodiments, the gallium nitride boule is grown epitaxially on a seed crystal. In some embodiments, the gallium nitride boule is grown ammonothermally. Alternatively, combinations of these techniques can also exist. Polycrystalline indium gallium nitride source material, with an indium content ranging from about 1 to about 50% by weight, may be formed by heating a crucible containing at least gallium and indium in an atmosphere comprising at least one of ammonia, a hydrogen halide, and an inert gas such as argon. The crucible may further contain a getter material at a level of at least about 100 parts per million (ppm) with respect to the gallium and indium. The getter may be selected from at least alkaline earth metals, scandium, titanium, vanadium, chromium, yttrium, zirconium, niobium, rare earth metals, hafnium, tantalum, and tungsten. The crucible may be placed within a reactor, heated to a temperature of at least about 400 degrees Celsius in an atmosphere comprising ammonia and a hydrogen halide for a period between about 30 minutes and about 72 hours, and cooled according to one or more embodiments. Further details of the process for synthesizing the polycrystalline indium gallium nitride are described in U.S. Patent Application Ser. No. 61/122,332, which is hereby incorporated by reference in its entirety. The resulting polycrystalline indium gallium nitride may have an oxygen content provided as a group III metal oxide or as a substitutional impurity within the indium gallium nitride that is less than about 10 parts per million (ppm), less than about 1 ppm, or less than about 0.1 ppm. Of course, there can be other variations, modifications, and alternatives.

At least one seed crystal may be provided for ammonothermal crystal growth according to a specific embodiment. In some embodiments the seed crystal is an indium gallium nitride single crystal, with an indium content ranging from about 1 to about 50% by weight. The seed crystal may have a wurtzite crystal structure. The seed crystal may have a dislocation density less than about $10^8$ cm$^{-2}$, less than about $10^7$ cm$^{-2}$, less than about $10^6$ cm$^{-2}$, less than about $10^5$ cm$^{-2}$, less than about $10^4$ cm$^{-2}$, or less than about less than about $10^3$ cm$^2$. The large area faces of the seed crystal may comprise c-plane (0001) and/or (000-1), m-plane (10-10), a-plane (11-20), or a semi-polar orientation such as {11-22}. The seed crystal may comprise a non-indium gallium nitride material such as sapphire, silicon carbide, spinel, or the like. The seed crystal may comprise at least one film of indium gallium nitride, with an indium content ranging from about 1 to about 50% by weight. The at least one indium gallium nitride film may be grown by metalorganic chemical vapor deposition (MOCVD), molecular beam epitaxy (MBE), hydride vapor phase epitaxy (HVPE), or liquid phase epitaxy (LPE). In some embodiments, both the front surface and the back surface of a heteroepitaxial seed material are coated by a film of indium gallium nitride, as described in U.S. Patent application Ser. No. 61/096,304, which is hereby incorporated by reference in its entirety. In a preferred embodiment, the lattice constants of the large-area surfaces of the seed crystal are within 1%, 0.3%, 0.1%, 0.03%, 0.01%, 0.003%, or 0.001% of the lattice constants of the bulk indium gallium nitride crystal to be grown on the seed crystal. At least two seed crystals may be mounted on a seed rack, as described in U.S. Patent application Ser. No. 61/087,135, which is hereby incorporated by reference in its entirety.

The polycrystalline indium gallium nitride and at least one seed crystal may be provided to an autoclave or a capsule for placement within an internally heated high pressure apparatus. Examples of suitable high pressure apparatus are described in U.S. patent application Ser. Nos. 12/133,364, 12/133,365, 61/073,687, and 61/087,122, which are hereby incorporated by reference in their entirety. A mineralizer is also provided to the autoclave or capsule. The mineralizer may comprise a base, such as at least one of an alkali metal, an alkali amide, an alkali imide, an alkali amido-imide, an alkali azide, an alkali nitride, an alkaline earth metal, an alkaline earth amide, an alkaline earth azide, or an alkaline earth nitride. The mineralizer may comprise an acid, such as at least one of an ammonium halide, a hydrogen halide, gallium halide, or a compound that may be formed by reaction of two or more of gallium metal, indium metal, ammonia, and a hydrogen halide. In some embodiments the mineralizer comprises two or more metal constituents, two or more halogen constituents, and/or two or more compounds. Ammonia may also be provided, at a percent fill between about 50% and about 98%, or between about 60% and about 90%, and the capsule or autoclave sealed. The capsule or autoclave may be heated to a temperature of at least about 400 degrees Celsius and a pressure of at least about 100 megapascal (MPa) in order to cause crystal growth upon at least one seed crystal. Additional details of the crystal growth process may be found in U.S. Patent application 2008/0087919.

Preferably, the gallium nitride substrate member has a semipolar crystalline surface region or a non-polar crystalline surface region. The device has an epitaxially formed laser stripe region comprising an indium content ranging from about 1 to about 50% and formed overlying a portion of the semipolar crystalline orientation surface region or the non-polar crystalline surface region. In a specific embodiment, the higher indium content InGaN substrate allows growth of InGaN layers with substantial levels of indium without degradation that occurs from strain induced defects or other imperfections. It is believed that much of the degradation observed with high indium content on nonpolar and semipolar substrates results from strain due the large lattice mismatch between the epitaxially grown InGaN layers and the base GaN substrate. In one or more preferred embodiments, the higher indium content substrate, which leads to lower defects, can be used for green lasers, possibly even yellow and red GaN based lasers along with very bright long wavelength LEDs, among other optical devices. Furthermore, we believe the benefits could be most true for nonpolar and semipolar where it is believed the degradation is strain related. In one or more embodiments, the gallium nitride substrate can include c-plane, a-plane, m-plane, and others. Of course, there can be other variations, modifications, and alternatives.

In a preferred embodiment, the present device and method provides improved PL (i.e., photoluminescence) and EL (i.e., electroluminescence) intensity. In one or more embodiments, the high indium content substrate leads to improvement in the PL and EL intensity when growing high indium content InGaN quantum wells on the InGaN substrate relative to on the GaN substrate. As merely an example, optical devices emitting in the wavelength ranges including, but not limited to 490-520, 520-550, 550-580, 590-630, 630-700 nm, the PL and/or EL intensity for a determined growth structure is at least 2× brighter when grown on the higher indium content InGaN substrate relative to the conventional GaN substrate. In one or more embodiments, the growth of quality In-containing layers such as InGaN with sufficient In content to achieve emission wavelengths beyond 400 nm to the blue, green, yellow and red regime. A further explanation of benefits and features of high indium content in gallium nitride materials is described in "Selective Area Epitaxy Growth Method and Structure," in the names of Raring, James W., Feezell, Daniel F., and Nakamura, Shuji and listed as U.S. Provisional No. 61/061,521 filed Jun. 13, 2008, commonly assigned and hereby incorporated by reference herein.

In a specific embodiment on semipolar GaN, the device has a laser stripe region formed overlying a portion of the semi polar crystalline orientation surface region. In a specific semipolar GaN embodiment, the laser stripe region is characterized by a cavity orientation is substantially parallel to the m-direction. In a specific embodiment, the laser strip region has a first end 107 and a second end 109.

In a specific embodiment on nonpolar GaN, the device has a laser stripe region formed overlying a portion of the semi or non-polar crystalline orientation surface region, as illustrated by FIG. 1B, for example. In a specific embodiment, the laser stripe region is characterized by a cavity orientation is substantially parallel to the c-direction. In a specific embodiment, the laser strip region has a first end and a second end. In a specific embodiment, the non-polar crystalline orientation is configured on an m-plane, which leads to polarization ratios parallel to the a-direction. In one or more embodiments, the m-plane is the (10-10) family. Of course, there cavity orientation can also be substantially parallel to the a-direction as well. In the specific nonpolar GaN embodiment having the cavity orientation substantially parallel to the c-direction is further described in "Laser Device and Method Using Slightly Miscut Non-Polar GaN Substrates," in the names of Raring, James W. and Pfister, Nick listed as U.S. Provisional Ser. No. 61/168,926 filed Apr. 13, 2009, commonly assigned, and hereby incorporated by reference for all purposes.

In a preferred semipolar embodiment, the device has a first cleaved m-face facet provided on the first end of the laser stripe region and a second cleaved m-face facet provided on the second end of the laser stripe region. In one or more embodiments, the first cleaved m-facet is substantially parallel with the second cleaved m-facet. In a specific embodiment, the semipolar substrate is configured on (11–22) series of planes, which enables the formation of m-facets for laser cavities oriented in the m-direction. Mirror surfaces are formed on each of the cleaved surfaces. The first cleaved m-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

In a preferred nonpolar embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. In a specific embodiment, the nonpolar substrate is configured on (10–10) series of planes, which enables the formation of c-facets for laser cavities oriented in the c-direction. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

Also in a preferred semipolar embodiment, the second cleaved m-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, titania, tantalum pentoxide, and zirconia, combinations thereof, and the like. In a specific embodiment, the second mirror surface comprises an anti-reflective coating. Of course, there can be other variations, modifications, and alternatives.

Also in a preferred nonpolar embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art. Further details of the present device can be found throughout the present specification and more particularly below In a specific semipolar embodiment, the device is also characterized by a spontaneously emitted light that is polarized in substantially parallel to the projection of the c-direction. That is, the device performs as a laser or the like. In a preferred embodiment, the spontaneously emitted light is characterized by a polarization ratio of greater than about 0.2 and less than about 1 parallel to the projection of the c-direction. In a preferred embodiment, the spontaneously emitted light characterized by a wavelength ranging from about 500 to about 580 nanometers to yield a green laser and others and the spontaneously emitted light is highly polarized and is characterized by a polarization ratio parallel to the projection of the c-direction of greater than 0.4. Of course, there can be other variations, modifications, and alternatives. Further details of the laser device can be found throughout the present specification and more particularly below.

In a specific nonpolar embodiment, the device is also characterized by a spontaneously emitted light that is polarized parallel to the a-direction. That is, the device performs as a laser or the like. In a preferred embodiment, the spontaneously emitted light is characterized by a polarization ratio of greater than about 0.1 and less than about 1 parallel to the projection of the c-direction. In a preferred embodiment, the spontaneously emitted light characterized by a wavelength ranging from about 475 to about 530 nanometers to yield a blue-green or green laser and others and the spontaneously emitted light is highly polarized and is characterized by a polarization ratio parallel to the a-direction of greater than 0.5. Of course, there can be other variations, modifications, and alternatives. Further details of the laser device can be found throughout the present specification and more particularly below.

FIG. 2 is a detailed cross-sectional view of a laser device 200 fabricated on a non-polar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, $v$, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), but can be others. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $Al_qIn_rGa_{1-q-r}N$, where $0 \leq q, r, q+r \leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives. Further details of the cleaved facets can be found throughout the present specification and more particularly below.

FIG. 3 is a simplified diagram illustrating a laser structure according to a preferred embodiment of the present invention. This diagram is merely an example, which should not unduly limit the scope of the claims herein. One of ordinary skill in the art would recognize other variations, modifications, and alternatives. In a specific embodiment, the device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 530 nm, but can be others. Of course, there can be other variations, modifications, and alternatives.

In a preferred embodiment, the growth structure is configured using between 3 and 5 or 5 and 7 quantum wells positioned between n-type GaN and p-type GaN cladding layers. In a specific embodiment, the n-type GaN cladding layer ranges in thickness from 500 nm to 2000 nm and has an n-type dopant such as Si with a doping level of between 1E18 cm-3 and 3E18 cm-3. In a specific embodiment, the p-type GaN cladding layer ranges in thickness from 500 nm to 1000 nm and has a p-type dopant such as Mg with a doping level of between 1E17 cm-3 and 5E19 cm-3. In a specific embodiment, the Mg doping level is graded such that the concentration would be lower in the region closer to the quantum wells. Of course, there can be other variations, modifications, and alternatives.

In a specific preferred embodiment, the quantum wells have a thickness of between 3 nm and 5.5 nm or 5.5 nm and 8 nm, but can be others. In a specific embodiment, the quantum wells would be separated by barrier layers with thicknesses between 4 nm and 8 nm or 8 nm and 12 nm. The quantum wells and the barriers together comprise a multiple quantum well (MQW) region. Of course, there can be other variations, modifications, and alternatives.

In a preferred embodiment, the device has barrier layers formed from GaN or InGaN.

In a specific embodiment using InGaN, the indium contents range from 1% to 5% (mole percent), but can be others. Of course, there can be other variations, modifications, and alternatives. Also, it should be noted that % of indium or aluminum is in a molar fraction, not weight percent. Of course, there can be other variations, modifications, and alternatives.

An InGaN separate confinement hetereostructure layer (SCH) could be positioned between the n-type GaN cladding and the MQW region according to one or more embodiments. Typically, such separate confinement layer is commonly called the n-side SCH. The n-side SCH layer ranges in thickness from 10 nm to 50 nm or 50 nm to 100 nm and ranges in indium composition from 1% to 7% (mole percent), but can be others. In a specific embodiment, the n-side SCH layer may or may not be doped with an n-type dopant such as Si. Of course, there can be other variations, modifications, and alternatives.

In yet another preferred embodiment, an InGaN separate confinement hetereostructure layer (SCH) is positioned between the p-type GaN cladding and the MQW region, which is called the p-side SCH. In a specific embodiment, the p-side SCH layer ranges in thickness from 10 nm to 50 nm or 50 nm to 100 nm and ranges in indium composition from 1% to 7% (mole percent), but can be others. The p-side SCH layer may or may not be doped with a p-type dopant such as Mg. Of course, there can be other variations, modifications, and alternatives.

In another embodiment, the structure would contain both an n-side SCH and a p-side SCH.

In a specific preferred embodiment, an AlGaN electron blocking layer, with an aluminum content of between 14% and 22% (mole percent), is positioned between the MQW and the p-type GaN cladding layer either within the p-side SCH or between the p-side SCH and the p-type GaN cladding. The AlGaN electron blocking layer ranges in thickness from 10 nm to 20 nm and is doped with a p-type dopant such as Mg from 1E18 cm-3 and 1E20 cm-3 according to a specific embodiment. Of course, there can be other variations, modifications, and alternatives.

Preferably, a p-contact layer positioned on top of and is formed overlying the p-type cladding layer. The p-contact layer would be comprised of GaN doped with a p-dopant such as Mg at a level ranging from 1E20 cm-3 to 1E22 cm-3. Of course, there can be other variations, modifications, and alternatives according to other embodiments.

In a specific embodiment, a non-polar or semi-polar or polar LED may be fabricated on a bulk gallium nitride substrate. The gallium nitride substrate may be sliced from a boule that was grown by hydride vapor phase epitaxy or ammonothermally, according to methods known in the art. In one specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. Semipolar planes may be designated by (hkil) Miller indices, where i=−(h+k), l is nonzero and at least one of h and k are nonzero. The gallium nitride substrate may be cut, lapped, polished, and chemical-mechanically polished. The gallium nitride substrate orientation may be within ±5 degrees, ±2 degrees, ±1 degree, or ±0.5 degrees of the {1 −1 0 0} m plane, the {1 1 −2 0} a plane, the {1 1 −2 2} plane, the {2 0 −2 ±1} plane, the {1 −1 0 ±1} plane, the {1 −1 0 −±2} plane, or the {1 −1 0 ±3} plane. gallium containing substrates such as GaN, MN, InN, InGaN, AlGaN, and AlInGaN, and others. In a specific embodiment, the substrate is a gallium and nitrogen containing {20–21} substrate which could be miscut or offcut towards the c-plane or towards the a-plane according to one or more embodiments, but there can be other configurations. The gallium nitride substrate may have a dislocation density in the plane of the large-area surface that is less than $10^8$ cm$^{-2}$, less than $10^7$ cm$^{-2}$, less than $10^6$ cm$^{-2}$, less than $10^5$ cm$^{-2}$, less than $10^4$ cm$^2$, or less than $10^3$ cm$^{-2}$. The gallium nitride substrate may have a dislocation density in the c plane that is less than $10^8$ cm$^{-2}$, less than $10^7$ cm$^{-2}$, less than $10^6$ cm$^{-2}$, less than $10^5$ cm$^2$, less than $10^4$ cm$^2$, or less than $10^3$ cm$^{-2}$. Of course, there can be other variations, modifications, and alternatives.

Although the above has been described in terms of specific embodiments, other variations, modifications, and alternatives can exist. The specific embodiments are not intended to unduly limit the scope of the claims herein. Further examples can be found throughout the present specification and more particularly below.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
   a gallium nitride substrate member comprising indium containing entities, gallium containing entities, and nitrogen containing entities, the gallium nitride substrate member having an indium content ranging from about 1 to about 50% by weight, the gallium nitride substrate member having a semipolar crystalline surface region or a non-polar crystalline surface region;
   laser stripe region comprising an indium content ranging from about 1 to about 50% by weight and formed overlying a portion of the semipolar crystalline orientation surface region or the non-polar crystalline surface region, the laser stripe region being characterized by a cavity orientation in a predefined direction, the laser strip region having a first end and a second end;
   a first cleaved facet provided on the first end of the laser stripe region; and
   a second cleaved facet provided on the second end of the laser stripe region;
   wherein the gallium nitride substrate member is sliced from a boule grown epitaxially on a seed crystal; and
   wherein the seed crystal comprises a seed lattice constant and the boule comprises a boule lattice constant, the seed lattice constant being within about 1% of the boule lattice constant.

2. The device of claim 1 wherein the first cleaved facet is substantially parallel with the second cleaved facet.

3. The device of claim 1 wherein the first cleaved facet comprises a first mirror surface.

4. The device of claim 1 wherein the second cleaved facet comprises a second mirror surface.

5. The device of claim 1 further comprising a spontaneously emitted light characterized by a wavelength ranging from about 500 to about 580 nanometers.

6. The device of claim 1 further comprising an n-type metal region overlying a backside of the gallium nitride substrate member and an overlying p-type metal region overlying an upper portion of the laser stripe.

7. The device of claim 1 further comprising an n-type gallium nitride region overlying the surface region, an active region overlying the n-type gallium nitride region, and the laser stripe region overlying the active region.

8. The device of claim 1 wherein the active region comprises an electron blocking region.

9. The device of claim 1 further comprising a spontaneously emitted light that is highly polarized and is characterized by a polarization ratio of greater than 0.4.

10. The device of claim 1, wherein the laser stripe region is epitaxially formed.

11. An optical device comprising:
a gallium nitride substrate member comprising indium containing entities, gallium containing entities, and nitrogen containing entities, the gallium nitride substrate member having an indium content ranging from about 1 to about 50% by weight, the gallium nitride substrate member having a semipolar crystalline surface region or a non-polar crystalline surface region;
laser stripe region comprising an indium content ranging from about 1 to about 50% by weight and formed overlying a portion of the semipolar crystalline orientation surface region or the non-polar crystalline surface region, the laser stripe region being characterized by a cavity orientation in a predefined direction, the laser strip region having a first end and a second end;
a first cleaved facet provided on the first end of the laser stripe region; and
a second cleaved facet provided on the second end of the laser stripe region;
wherein the gallium nitride substrate member is sliced from a boule grown epitaxially on a seed crystal;
wherein the seed crystal comprises a seed lattice constant and the boule comprises a boule lattice constant, the seed lattice constant being within about 1% of the boule lattice constant; and
wherein the seed lattice constant comprises a first constant and a second constant and the boule lattice constant comprises a third constant and a fourth constant, the first constant and the third constant being within about 1% of each other, and the second constant and the fourth constant being within about 1% of each other.

12. The device of claim 11 wherein the first cleaved facet is substantially parallel with the second cleaved facet.

13. The device of claim 11 wherein the first cleaved facet comprises a first mirror surface.

14. The device of claim 11 wherein the second cleaved facet comprises a second mirror surface.

15. The device of claim 11 further comprising a spontaneously emitted light characterized by a wavelength ranging from about 500 to about 580 nanometers.

16. The device of claim 11 further comprising an n-type metal region overlying a backside of the gallium nitride substrate member and an overlying p-type metal region overlying an upper portion of the laser stripe.

17. The device of claim 11 further comprising an n-type gallium nitride region overlying the surface region, an active region overlying the n-type gallium nitride region, and the laser stripe region overlying the active region.

18. The device of claim 11 wherein the active region comprises an electron blocking region.

19. The device of claim 11 further comprising a spontaneously emitted light is highly polarized and that is characterized by a polarization ratio of greater than 0.4.

20. The device of claim 11, wherein the laser stripe region is epitaxially formed.

* * * * *